(12) United States Patent
Jung et al.

(10) Patent No.: US 9,156,681 B2
(45) Date of Patent: Oct. 13, 2015

(54) SEMICONDUCTOR DEVICE AND METHOD FOR MANUFACTURING THE SAME

(71) Applicant: DONGBU HITEK CO., LTD., Gyeonggi-do (KR)

(72) Inventors: Chung Kyung Jung, Gyeonggi-do (KR); Ki Jun Yun, Gyeonggi-do (KR); Oh Jin Jung, Gyeonggi-do (KR); Sang Wook Ryu, Chungcheongbuk-do (KR); Seong Hun Jeong, Gyeonggi-do (KR); Sung Wook Joo, Gyeongsangnam-do (KR)

(73) Assignee: Dongbu HiTek Co., Ltd., Gyeonggi-do (KR)

( * ) Notice: Subject to any disclaimer, the term of this patent is extended or adjusted under 35 U.S.C. 154(b) by 90 days.

(21) Appl. No.: 13/963,409

(22) Filed: Aug. 9, 2013

(65) Prior Publication Data

US 2014/0070336 A1  Mar. 13, 2014

(30) Foreign Application Priority Data

Sep. 7, 2012  (KR) .......................... 10-2012-0099218

(51) Int. Cl.
*H01L 21/00* (2006.01)
*B81C 1/00* (2006.01)
*B81B 3/00* (2006.01)

(52) U.S. Cl.
CPC ........... *B81C 1/00015* (2013.01); *B81B 3/0018* (2013.01); *B81C 1/00801* (2013.01); *B81B 2201/018* (2013.01); *B81C 2201/014* (2013.01)

(58) Field of Classification Search
CPC ........................ B81B 3/0018; B81C 1/00015
USPC ....................................... 438/50–51; 257/415
See application file for complete search history.

(56) References Cited

U.S. PATENT DOCUMENTS

| | | | |
|---|---|---|---|
| 3,927,286 A | 12/1975 | Fohl | |
| 4,450,326 A | 5/1984 | Ledger | |
| 5,955,713 A | 9/1999 | Titus et al. | |
| 8,691,610 B1 * | 4/2014 | Jeong et al. | 438/50 |
| 2009/0266168 A1 * | 10/2009 | Shimase | 73/649 |

OTHER PUBLICATIONS

Dec. 27, 2013, communication from Korean Patent Office regarding related Korean application.

* cited by examiner

*Primary Examiner* — Theresa T Doan
(74) *Attorney, Agent, or Firm* — Andrew D. Fortney; Central California IP Group, P.C.

(57) ABSTRACT

Method for manufacturing a semiconductor device includes the steps of forming a lower electrode pattern on a substrate, forming a first interlayer insulating layer on the lower electrode pattern, forming an upper electrode pattern on the first interlayer insulating layer, forming a second interlayer insulating layer on the upper electrode pattern, forming an etch blocking layer on a side of the upper electrode pattern, wherein the etch blocking layer passes through the first interlayer insulating layer, forming a cavity which exposes the side of the etch blocking layer by etching the second interlayer insulating layer, and forming a contact ball in the cavity.

14 Claims, 7 Drawing Sheets

SEMICONDUCTOR DEVICE AND METHOD FOR MANUFACTURING THE SAME

This application claims the benefit of the Patent Korean Application No. 10-2012-0099218, filed on Sep. 7, 2012, which is hereby incorporated by reference in its entirety.

BACKGROUND

Embodiments relate to semiconductor devices and/or methods for manufacturing semiconductor devices. Embodiments relate to Micro Metal Sphere switches and methods for manufacturing Micro Metal Sphere switches.

MEMs (Micro Metal Sphere system) devices may be devices having a relatively small size (e.g. micro-scale) which may perform electro-mechanical operations. At least a portion of MEMs device manufacturing may include specialized semiconductor processing, for which low priced batch manufacturing may be desirable.

MEMs devices have a wide range of applications. Examples include sensors, pressure sensors, inertia sensors, position sensors (e.g. for GPS systems and a game consoles), image sensors (e.g. for digital cameras and camcorder), RF switches, micro-resonators, variable capacitors, and/or variable inductors. In embodiments, MEMs devices switching applications may have manufacturing requirements related to reliability and/or a stable manufacturing yield.

SUMMARY

Embodiment relate to semiconductor device and/or method of manufacturing semiconductor devices which may enable optimized degrees of freedom of an upper electrode pattern, assure reliability of switching, and/or optimize manufacturing yield from dropping; and a method for manufacturing the same.

Embodiments relate to a method for manufacturing a semiconductor device including at least one of the following steps: (1) Forming a lower electrode pattern on/over a substrate. (2) Forming a first interlayer insulating layer on/over the lower electrode pattern. (3) Forming an upper electrode pattern on/over the first interlayer insulating layer. (4) Forming a second interlayer insulating layer on/over the upper electrode pattern. (5) Forming an etch blocking layer on/over a side of the upper electrode pattern, wherein the etch blocking layer may pass through the first interlayer insulating layer. (6) Forming a cavity which exposes a side of the etch blocking layer by etching the second interlayer insulating layer. (7) Forming a contact ball in the cavity.

Embodiments include a step of forming an etch stop film between the lower electrode pattern and the first interlayer insulating layer. In embodiments, the forming a lower electrode pattern may include the step of forming a plurality of lower electrodes spaced from one another on/over the substrate. In embodiments, the step of forming an upper electrode pattern may include a step of forming a plurality of upper electrodes spaced from one another on/over the first interlayer insulating layer. In embodiments, the step of forming an etch blocking layer may include forming an etch blocking layer covering a side of each of the plurality of upper electrodes.

In embodiments, the step of forming an etch blocking layer may include at least one of the following steps: (1) Forming a plurality of trenches in which each trench exposes a side of each of the plurality of the upper electrodes. (2) Forming the etch blocking layer by filling the plurality of trenches with a conductive material.

In embodiments, the upper electrode pattern may be formed of a material including at least one of: Al, Cu, Au, [an alloy including at least one of Al, Cu, and Au], and/or similar material. In embodiments, the first interlayer insulating layer and the second interlayer insulating layer may include at least one of SiO2, SixNy (where x, and y are real numbers), FSG (Fluoro Silicate glass), USG (Undoped Silicate Glass), BPSG (Boron Phospho Silicate Glass), TEOS (TetraEthOxySilane), and/or similar material. In embodiments, the etch blocking layer may be formed of tungsten and/or similar material.

Each of the trenches may expose a portion of an upper side of the upper electrode adjacent to an exposed side of the upper electrode, in accordance with embodiments.

In embodiments, the step of forming the etch blocking layer may include forming the etch blocking layer on/over a side of the upper electrode and/or on/over a portion of the upper side of the upper electrode adjacent to the side of the upper electrode. The etch blocking layer may be formed to be in contact with the etch stop film and may pass through the second interlayer insulating layer.

The etching of the second interlayer insulating layer to form a cavity may include forming a hole which exposes the etch stop film by first etching the second interlayer insulating layer and the first interlayer insulating layer to form a cavity, in accordance with embodiments. In embodiments, the cavity may expose the etch blocking layer by a second etching of the second interlayer insulating layer and the first interlayer insulating layer which were previously etched.

The first etching may be a dry etching, in accordance with embodiments. In embodiments, the second etching may be wet etching. In embodiments, the wet etching may include a first wet etching with DHF (Diluted HF) with an HF to H2O ratio of 1~1000:1. Thesecond etching may be with BHF (Buffered HF) with an NH4F to HF ratio of 3~100:1, in accordance with embodiments.

Embodiments include forming a barrier layer between the etch blocking layer and the trench.

Embodiments include forming a contact in contact with the lower electrode pattern which passes through the first interlayer insulating layer and the etch stop film. The second upper electrode pattern may be formed to be in contact with the contact.

In embodiments, a semiconductor device may include at least one of: (1) a substrate, (2) a lower electrode pattern formed on/over the substrate, (3) an etch stop film formed on/over the lower electrode pattern, (4) a first interlayer insulating layer formed on/over the etch stop film, (5) an upper electrode pattern formed on/over the first interlayer insulating layer, (6) a second interlayer insulating layer formed on/over the upper electrode pattern, (7) an etch blocking layer formed in the second interlayer insulating layer and/or positioned on/over a side of the upper electrode, (8) a cavity formed in the second interlayer insulating layer, wherein the cavity exposes the etch blocking layer, and (9) a contact ball formed in the cavity.

In embodiments, the semiconductor device may include a contact which connects the lower electrode pattern to the upper electrode pattern, wherein the contact may pass through the first interlayer insulating layer and the etch stop film. In embodiments, the cavity may be formed in the second interlayer insulating layer and the first interlayer insulating layer. The cavity may expose the etch stop film. The etch blocking layer may be in contact with the etch stop film. In embodiments, the etch blocking layer may be positioned on/over a portion of the upper side of the upper electrode pattern adjacent to a side of the upper electrode pattern.

It is to be understood that both the foregoing general description and the following detailed description of embodiments are exemplary and explanatory and are intended to provide further explanation of the embodiments as claimed.

DRAWINGS

Example

DESCRIPTION

Example FIGS. 2 to 10 illustrate steps of a method for manufacturing a semiconductor device, in accordance with embodiments. For example, embodiments may relate a method for manufacturing an MEM (Micro Metal Sphere) switch.

Figure 2:
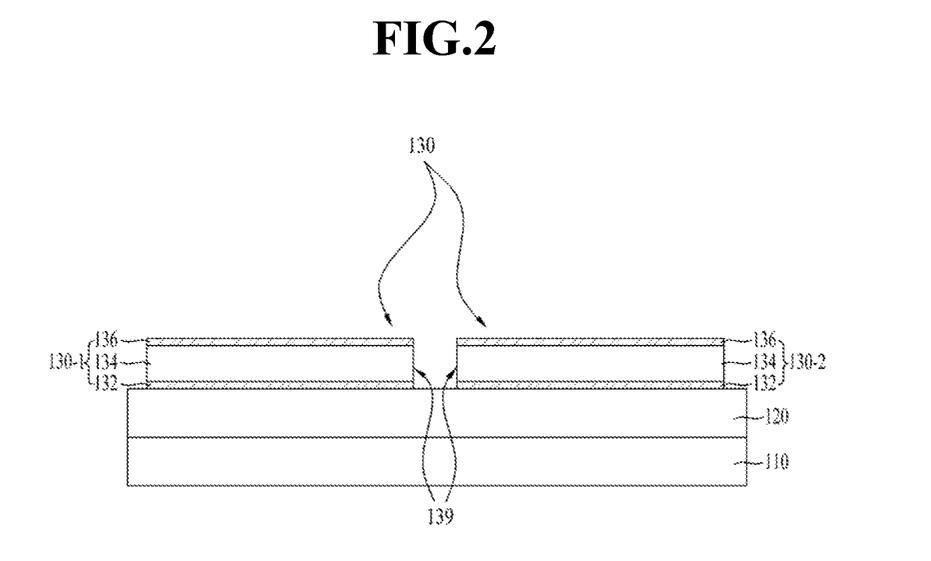
FIGS. 2 to 10 illustrate an example method for manufacturing a semiconductor device, in accordance with embodiments.

Referring to example FIG. 2, an insulating layer 120 may be formed on a substrate 110, in accordance with embodiments. The substrate 110 may be a mono-crystalline silicon substrate, a poly-crystalline silicon substrate, a semiconductor substrate, and/or of similar material, in accordance with embodiments. The substrate 110 may have a device isolation film formed thereon for dividing an active region and a device isolation region. The substrate 110 may have p type impurities or n type impurities doped therein.

The insulating layer 120 may include at least one of oxide or nitride and may be single or multi-layered. For example, the insulating layer 120 may be deposited on/over the substrate by CVD (Chemical Vapor Deposition) and may include at least one of (but not limited to) SiO2, SixNy (Where, x, and y are real numbers), FSG (Fluoro Silicate glass), USG (Undoped Silicate Glass), BPSG (Boron Phospho Silicate Glass), TEOS (TetraEthOxySilane), and/or similar material.

A lower electrode pattern 130 may be formed on/over the insulating layer 120. The lower electrode pattern 130 may have a structure having a stack of a first barrier layer 132, a first main electrode layer 134, and a second barrier layer 136. The first barrier layer 132 and the second barrier layer 136 may serve to prevent metal ions of the first main electrode layer 134 from diffusing to other layer (e.g. the insulating layer 120), in accordance with embodiments.

The first and the second barrier layers 132 and 136 may be formed of a material which blocks diffusion of the metal ions (e.g. TiN, Ti or a TiN/Ti alloy). The first main electrode layer 134 may be formed of a material having relatively good conductivity (e.g. Al, Au, Cu, an alloy including at least one of Al, Au, and Cu, an Al—Cu alloy, and/or similar material).

The lower electrode pattern 130 may include a plurality of lower electrodes (e.g. 130-1 and 130-2) spaced from one another and substantially electrically isolated from one another. For example, the lower electrode pattern 130 may include a first lower electrode 130-1 and a second lower electrode 130-2 spaced apart from each other and substantially electrically isolated from each other. Though FIG. 2 illustrates only two lower electrodes 130-1 and 130-2, any practical number of the lower electrodes (e.g. more than 3) may be implemented in accordance with embodiments.

For example, by depositing the first barrier layer 132, the first main electrode layer 134, and the second barrier layer 136 on/over the insulating layer 120 in succession by CVD (Chemical Vapor Deposition), and by patterning the deposited layers 132, 134, and 136 through photolithography and etching processes, a plurality of lower electrodes (e.g. 130-1 and 130-2) may be formed.

Referring to FIG. 2, sides 139 of the first main electrode layers 134 of the first lower electrode 130-1 and the second lower electrode 130-2 may be exposed and opened from the first and second barrier layers 132 and 136, respectively by patterning through the photolithography and etching processes, in accordance with embodiments. Moreover, a portion of the insulating layer 120 (e.g. a portion of an upper side of the insulating layer 120) may be exposed and opened by patterning through the photolithography and etching processes, in accordance with embodiments.

Figure 3:
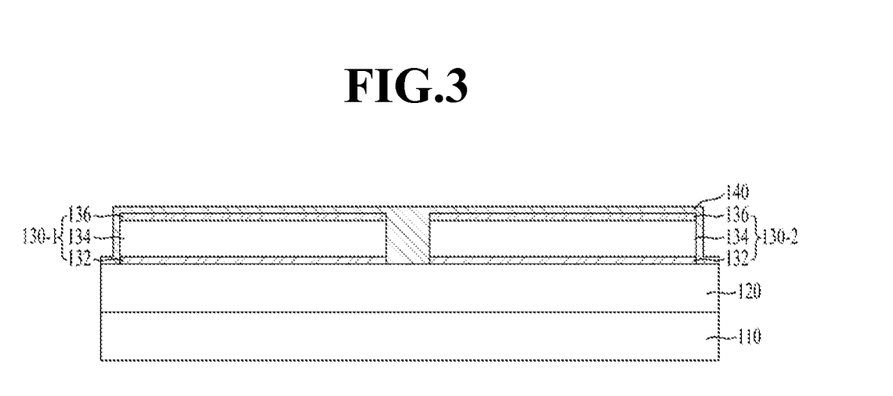

Referring to FIG. 3, an etch stop film 140 may be formed on/over the insulating layer 120 to cover the lower electrode pattern 130, in accordance with embodiments. For example, the etch stop film 140 may be formed on exposed sides 139 of the first and second barrier layers 132 and 136, an upper side of the barrier layer 136, and the portion of the insulating layer 120 exposed thus in FIG. 2, in accordance with embodiments.

Figure 9:
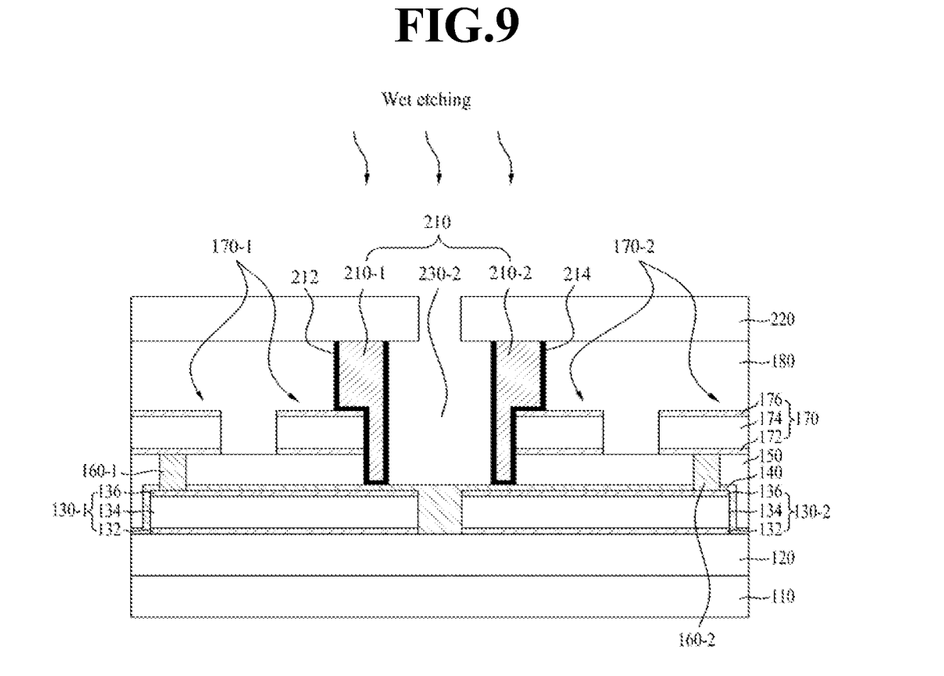

The etch stop film 140 may serve to stop etching during etching to provide a space 230-2 shown in FIG. 9 to position a contact ball therein, in accordance with embodiments. For example, the etch stop film 140 may be formed of a material having an etch selectivity higher than an interlayer insulating layer 150 (e.g. silicon nitride SiN).

Figure 4:
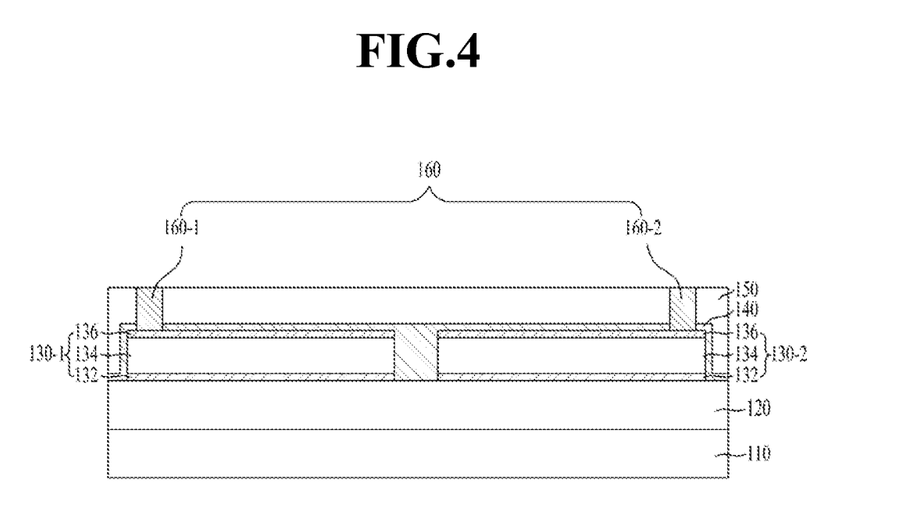

Referring to FIG. 4, the first interlayer insulating layer 150 is formed on/over the etch stop film 140, in accordance with embodiments. For example, in embodiments, the first interlayer insulating layer 150 may be formed on/over the etch stop film 140 by CVD (Chemical Vapor Deposition) and may include at least one of oxide and nitride or at least one of (but not limited to) SiO2, SixNy (Where, x, and y are real numbers), FSG (Fluoro Silicate Glass), USG (Undoped Silicate Glass), BPSG (Boron Phospho Silicate Glass), TEOS (TetraEthOxySilane), and/or similar material.

A plurality of contacts 160 may be formed in the first interlayer insulating layer 150 and the etch stop film 140, in accordance with embodiments. The plurality of contacts 160 may pass through the first interlayer insulating layer 150 and the etch stop film 140 and may be in contact with the lower electrode pattern 130. For example, a first contact 160-1 in contact with the first lower electrode 130-1 and a second contact 160-2 may be in contact with the first lower electrode 130-2. Although FIG. 4 illustrates only two contacts, any practical number of the contacts (e.g. three or more) may be implemented, in accordance with embodiments. At least one contact may be formed to be in contact with each of the plurality of the lower electrodes (e.g. 130-1 and 130-2), respectively.

Although the contact 160 may be formed as disclosed below, other methods for forming the contact 160 may be implemented, in accordance with embodiments. For example, a photoresist pattern may be formed on/over the first interlayer insulating layer 150. The first interlayer insulating layer 150 and the etch stop film 140 may be etched by using the photoresist pattern as an etch mask to form a via hole. A conductive material (e.g. tungsten) may be filled into the formed via hole and planarized, to form the contact.

Figure 5:
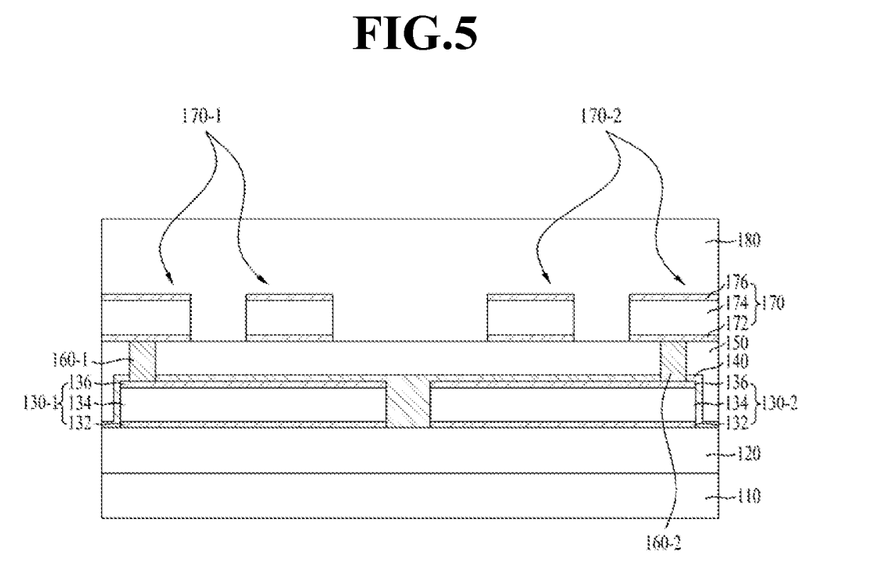

Referring to FIG. 5, an upper electrode pattern 170 may be formed on/over the first interlayer insulating layer 150, in accordance with embodiments. The upper electrode pattern 170 may have a structure having a stack of a third barrier layer 172, a second main electrode layer 174, and a fourth barrier layer 176. The third barrier layer 172 and the fourth barrier layer 176 may serve to prevent metal ions of the second main electrode layer 174 from diffusing to other layers (e.g. the first and second interlayer insulating layers 150 and 180).

The third and fourth barrier layers 172 and 176 may be formed of a barrier metal material, such as TiN, Ti, or a TiN/Ti alloy. The second main electrode layer 174 may be formed of a material having relatively good conductivity, such as Al, Au, Cu, an alloy including at least one of Al, Au, and Cu, an Al—Cu alloy, and/or similar material.

The upper electrode pattern 170 may include a plurality of upper electrodes (e.g. 170-1 and 170-2) spaced apart from one another and electrically isolated from one another. For example, the upper electrode pattern 170 may include the first upper electrode 170-1 and the second upper electrode 170-2, in accordance with embodiments.

For example, by depositing the third barrier layer 172, the second main electrode layer 174, and the fourth barrier layer 176 on/over the first interlayer insulating layer 150 by CVD (Chemical Vapor Deposition) in succession, and patterning the deposited layers 172, 174, and 176 through photolithography and etching processes, the plurality of the upper electrodes (e.g. 170-1, and 170-2) may be formed to be spaced apart from one another.

Sides of the plurality of the upper electrodes (e.g. 170-1, and 170-2) may be exposed or opened by patterning through photolithography and etching processes, in accordance with embodiments. For example, sides 149-1 and 149-2 of the second main electrode layers 174 in the plurality of the upper electrodes (e.g. 170-1, and 170-2) may be exposed or opened from the third or fourth barrier layers 172 and 176. In embodiments, a portion of the first interlayer insulating layer 150 (e.g. a portion of an upper side of the first interlayer insulating layer 150) may be exposed and/or opened by patterning through photolithography and etching processes.

The upper electrode pattern 170 may be electrically connected to the lower electrode pattern 130 with the contact 160, in accordance with embodiments. For example, the first upper electrode 170-1 may be electrically connected to the first contact 160-1 and the second upper electrode 170-2 may be electrically connected to the second contact 160-2. At least one of the plurality of the upper electrodes (e.g. 170-1 and 170-2) may be positioned on/over the contact 160 and may be in contact with the contact 160. For example, a portion of the first upper electrode 170-1 may be positioned on/over the first contact 160-1 and may be in contact with the first contact 160-1. A portion of the second upper electrode 170-2 may be positioned on/over the second contact 160-2 and may be in contact with the second contact 160-2.

A second interlayer insulating layer 180 may be formed on/over the first interlayer insulating layer 150 to cover the upper electrode pattern 170. The second interlayer insulating layer 180 may be formed of a material and by a method, which is the same or similar with the first interlayer insulating layer 150 described above, in accordance with embodiments.

Figure 6:
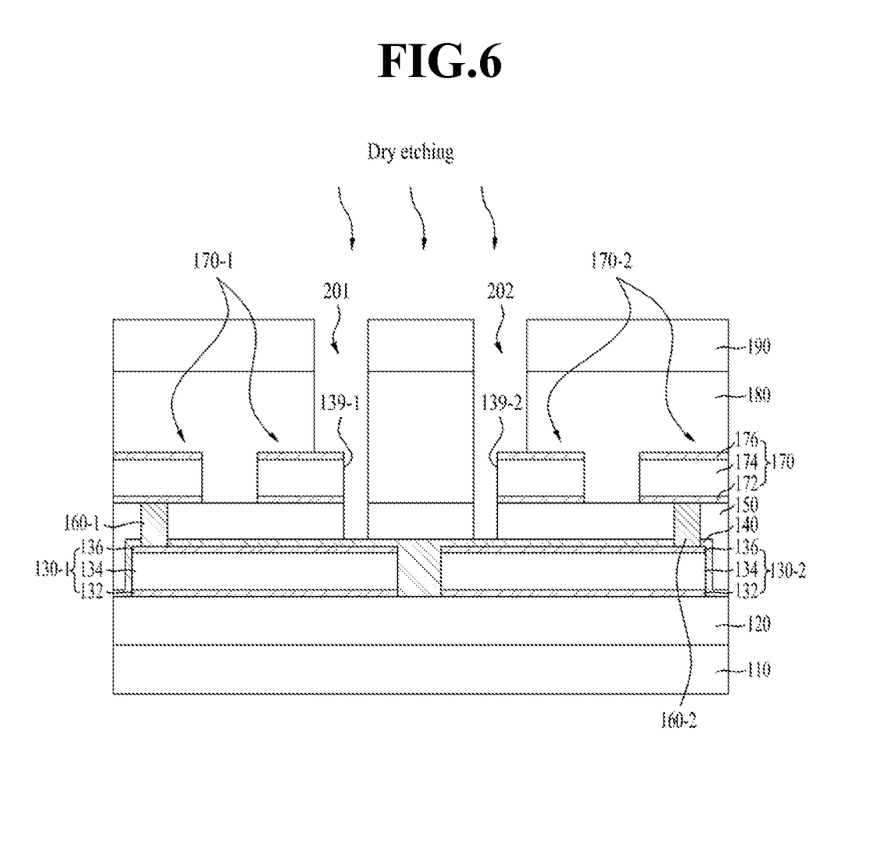

Referring to FIG. 6, a plurality of trenches (e.g. 201, and 202) may be formed to expose sides of the plurality of the upper electrodes (e.g. 170-1 and 170-2), respectively. The trenches may expose portions of upper sides of the upper electrodes (e.g. 170-1 and 170-2) adjacent to the exposed sides 139-1 and 139-2 of the upper electrodes (e.g. 170-1 and 170-2), respectively.

The trenches 201 and 202 which expose the side 139-1 of the first upper electrode 170-1 and the side 139-2 of the second upper electrode 170-2 may be formed in the second interlayer insulating layer 180, in accordance with embodiments. The number of the trenches 201 and 202 may be the same or larger than, the number of the upper electrodes, in accordance with embodiments.

For example, a photoresist pattern 190 may be formed on/over the second interlayer insulating layer 180 by photolithography for forming the trenches 201 and 202. Then, an example step of etching the second interlayer insulating layer 180 (hereafter referred to as "a trench forming etching step") may be performed by using the photoresist pattern 190 as an etch mask, to form the first trench 201 which exposes the side 139-1 of the first upper electrode 170-1, and the second trench 202 which exposes the side 139-2 of the second upper electrode 170-2.

The trench forming etching step may expose a portion of the upper side of the first upper electrode 170-1 adjacent to the side 139-1 of the first upper electrode 170-1 and a portion of the upper side of the second upper electrode 170-2 adjacent to the side 139-2 of the second upper electrode 170-2.

In embodiments, the first trench 201 may expose a portion of the upper side of the first upper electrode 170-1 adjacent to the side 139-1 of the first upper electrode 170-1 and the second trench 202 may expose a portion of the upper side of the second upper electrode 170-2 adjacent to the side 139-2 of the second upper electrode 170-2, in accordance with embodiments.

The trench forming etching step may etch not only the second interlayer insulating layer 180, but also the first interlayer insulating layer 150, in accordance with embodiments. The etching may stop after the etch stop film 140 is exposed and the plurality of trenches (e.g. 201 and 202) may expose the etch stop film 140. In embodiments, the etch stop film 140 may serve as an etch stop film of the etching performed for forming the trenches.

For example, in embodiments, the trenches 201 and 202 may respectively expose the sides 139-1 and 139-2 of the first upper electrode 170-1 and the second upper electrode 170-2 which face the space 230-2 having a contact ball positioned therein or opposite to each other. In embodiments, the sides 139-1 and 139-2 of the first upper electrode 170-1 and the second upper electrode 170-2 exposed thus may face each other.

In embodiments, the first trench 201 may expose one side of the second main electrode layer 174 of the first upper electrode 170-1 and the second trench 202 may expose one side of the second main electrode layer 174 of the second upper electrode 170-2.

In embodiments, the first trench 201 may expose a portion of an upper side of the fourth barrier layer 176 of the first upper electrode 170-1 adjacent to a side of the second main electrode layer 174 of the first upper electrode 170-1 exposed thus. The second trench 202 may expose a portion of an upper side of the fourth barrier layer 176 of the second upper electrode 170-2 adjacent to the second main electrode layer 174 of the second upper electrode 170-2.

Figure 7:
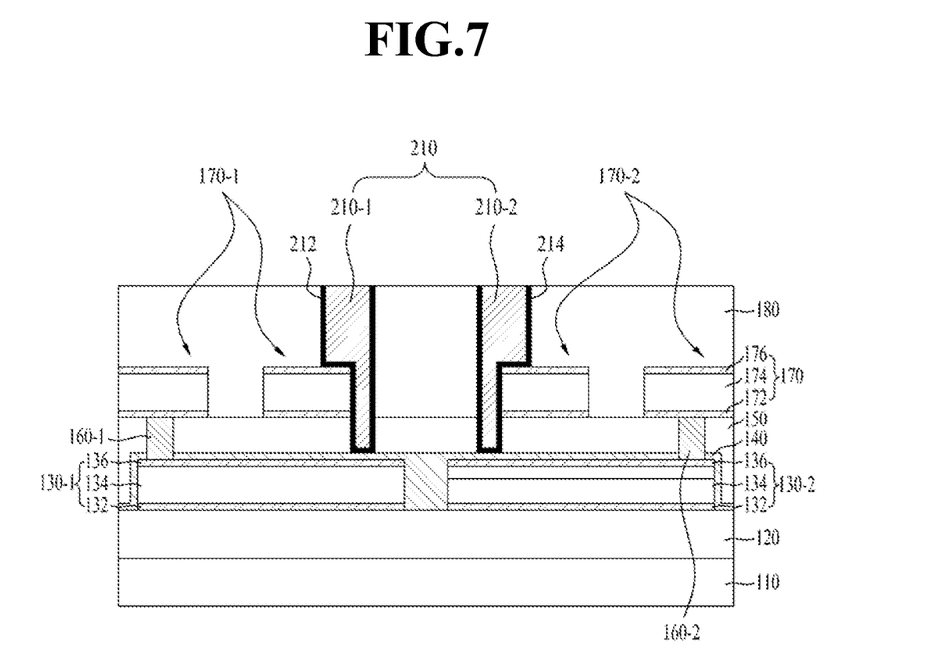

In embodiments, a portion of each of the fourth barrier layer 176 and the main electrode layer 174 of the first upper electrode 170-1 and the second upper electrode 170-2 exposed in the trench forming etching step may be etched and removed. Referring to FIG. 7, by removing the remaining photoresist pattern 190, and filling a conductive material in the trenches 201 and 202, an etch blocking layer 210 may beformed. The photoresist pattern 190 may be removed by ashing or striping, in accordance with embodiments.

The etch blocking layer 210 may be formed in each of the plurality of trenches (e.g. 201 and 202). The etch blocking layer 210 may be positioned on a side 139-1 or 139-2 of each of the upper electrodes (e.g. 170-1 and 170-2), in accordance with embodiments. The etch blocking layer 210 may also be positioned on a portion of an upper side of each of the upper electrodes 170-1 and 170-2 adjacent to the side 139-1 and 139-2, in accordance with embodiments. In embodiments, the etch blocking layers 210 may cover the sides 139-1 or 139-2 and the portions of the upper sides of the upper electrodes 170-1 and 170-2 adjacent to the side 139-1 or 139-2.

In embodiments, the etch blocking layers (e.g. 210-1 and 210-2) may be positioned on the sides 139-1 and 139-2 of the plurality of upper electrodes (e.g. 170-1 and 170-2) and may be spaced from one another. However, embodiment are not limited and a structure of the etch blocking layer 210 may be formed based on a shape of the upper electrode pattern 170. In embodiments, at least one of the plurality of the etch blocking layers 210 positioned on the sides of the upper electrodes may be different from one another and may be connected to each other.

The etch blocking layer 210 may include a first portion A1 (shown in example FIG. 10) which overlaps with the upper electrode 170-1 or 170-2 in a vertical direction, and a second portion A2 (See FIG. 10) which does not overlap with the upper electrode 170-2 or 170-2 in the vertical direction. In embodiments, the first portion µl and the second portion A2 may be in contact with each other and may be one unit. For example, in embodiments, the first etch blocking layer 210-1 may be formed in the first trench 201 to cover the side of the first upper electrode 170-1 and the second etch blocking layer 210-2 may be formed in the second trench 202 to cover the side of the second upper electrode 170-2.

If the trenches (e.g. 201 and 202) expose the etch stop film 140 passing through the first interlayer insulating layer 150, an underside of the etch blocking layer 210 may be in contact with the etch stop film 140. The etch blocking layer 210 may be formed of a conductive material having etch selectivity higher than the first and second interlayer insulating layers 150 and 180 (e.g. tungsten), in accordance with embodiments.

In order to prevent metal ions of the etch blocking layers 210-1 and 210-2 from diffusing to the interlayer insulating layers 150 and 180, a barrier layer 212 or 214 may be formed between the etch blocking layer 210-1 or 210-2 and the trench 201 or 202, in accordance with embodiments. For example, in embodiments, the etch blocking layers 210-1 and 210-2 and the barrier layers 212 and 214 may be formed by first depositing a barrier metal material and an etch blocking material on/over the second interlayer insulating layer 180 in succession to fill the trenches 201 and 202 by using CVD. The barrier metal material deposited may have a thickness of between approximately 50 Å and 200 Å, in accordance with embodiments.

In embodiments, the barrier metal material may be a material that is the same or similar with the first to fourth barrier layers 132, 136, 172, and 176 described above, in accordance with embodiments. The etch blocking material may be (but not limited to) tungsten and/or may be a conductive material having an etch selectivity higher than the first and second interlayer insulating layers 150 and 180, in accordance with embodiments.

In embodiments, by planarizing the etch blocking material and the barrier metal material formed on/over the second interlayer insulating layer 180 to expose an upper surface of the second interlayer insulating layer 180, the etch blocking layers 210-1 and 210-2 and the barrier layers 212 and 214 may be formed in the trenches 201 and 202, respectively.

Figure 8:
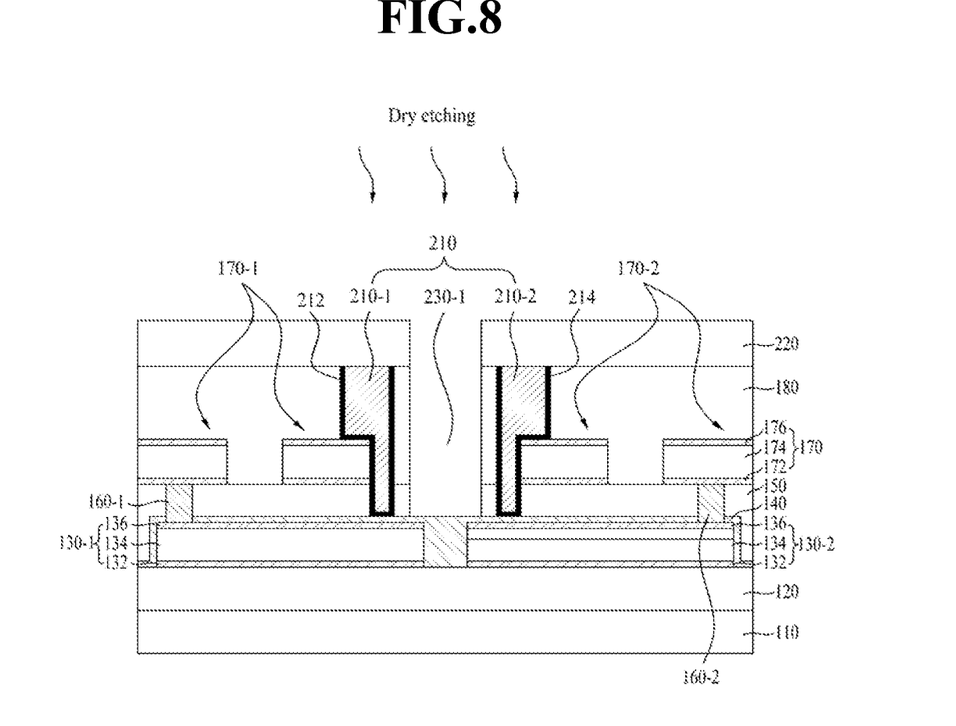

Referring to example FIG. 8, a photoresist pattern 220 may be formed on/over the second interlayer insulating layer 180 by photolithography, in accordance with embodiments. The photoresist pattern 220 may expose at least a portion of an upper side of the second interlayer insulating layer 180 positioned between the etch blocking layers (e.g. 210-1 and 210-2) of the plurality of the upper electrodes (e.g. 170-1 and 170-2), in accordance with embodiments. For example, the photoresist pattern 220 may expose at least a portion of the upper side of the second interlayer insulating layer 180 positioned between the first etch blocking layer 210-1 and the second etch blocking layer 210-2, in accordance with embodiments.

In embodiments, a first etching may be performed, in which the second interlayer insulating layer 180 and the first interlayer insulating layer 150, may be positioned between the etch blocking layers 210-1 and 210-2 of the plurality of upper electrodes (e.g. 170-1 and 170-2), may be etched to form a hole 230-1 which exposes the etch stop film 140.

In embodiments, the first etching may be dry etching. The etch stop film 140 may serve as an etch stop film in the first etching and the hole 230-1 may expose a portion of the etch stop film 140.

Referring to example FIG. 9, a second etching may be performed, in which the second interlayer insulating layer 180 and the first interlayer insulating layer 150 which may be etched in the first etching are etched by using the photoresist pattern 220 as an etch mask, to form a cavity 230-2 which may expose the etch blocking layers 210-1 and 210-2, in accordance with embodiments. The cavity 230-2 may expose one side of each of the etch blocking layers 210-1 and 210-2 and the sides of the etch blocking layers 210-1 and 210-2 exposed thus may face each other, in accordance with embodiments.

In embodiments, the second etching may be a wet etching using an etchant which is a mixture of (for example) DIW (DeIonized Water) mixed with an HF group chemical. In the second etching, the etchant may flow into the hole 230-1 to etch the second interlayer insulating layer 180 and the first interlayer insulating layer 150, in accordance with embodiments. In embodiments, the second etching may include at least one of the following steps: (1) Etching for 1 to 20 minutes with DHF (Diluted HF) with an HF to H2O ratio of 1~1000:1, and/or etching for 1 to 20 minutes with BHF (Buffered HF) with an NH4F to HF ratio of 3~100:1.

In embodiments, the etch blocking layers 210-1 and 210-2 may serve to protect the first upper electrode 170-1 and the second upper electrode 170-2 from the second etching. Since the etch blocking layers 210-1 and 210-2 may have an etch selectivity higher than the interlayer insulating layer 180 and 150 (which are not to be etched in the second etching), the etch blocking layers 210-1 and 210-2 may protect the first upper electrode 170-1 and the second upper electrode 170-2 from the second etching.

In embodiments, the cavity 230-2 may expose the etch stop film 140 and/or the etch stop film 140 may serve as an etch stop film to prevent the lower electrode pattern 130 from being damaged due the second etching.

In embodiments, the material of the second main electrode layer 174 of each of the first upper electrode 170-1 and the second upper electrode 170-2 (e.g. Cu, Al, Au, a Cu—Al alloy, and/or similar material) may be susceptible to damage by the etchant in the second etching. In embodiments, the etchant in the second etching may be a relatively strong acid and/or the material of the main electrode layer 174, may beliable to be etched by the strong acid.

If there are no etch blocking layers 210-1 and 210-2 of embodiments, the second interlayer insulating layer 180 and the first interlayer insulating layer 150 may be wet etched in the second etching to expose a side and an upper side of each of the first upper electrode 170-1 and the second upper electrode 170-2 making the side of the main electrode layer 174 of each of the first upper electrode 170-1 and the second upper electrode 170-2 susceptible to damage by the etchant in the second etching, which may cause malfunction of switching of the semiconductor device, thereby making reliability and yield of the semiconductor device poor.

In embodiments, by forming the etch blocking layers 210-1 or 210-2 of a material having etch selectivity higher than the first and second interlayer insulating layers 150 and 180 that covers the side of the first upper electrode 170-1 or the second upper electrodes 170-2 (which may be liable to be exposed to the second etching), embodiments may prevent the second main electrode layers 174 of the first upper electrode 170-1 and the second upper electrode 170-2 from being etched and damaged by the etchant in the second etching. In embodiments, this may be because the tungsten of the etch blocking layers 210-1 and 210-2 has a low extent of etching by the strong acid compared to the material of the second main electrode layer 174.

In embodiments, the formation of the upper electrode pattern 170 of a material insensitive to the wet etching etchant for securing the cavity 230-2, the contact ball may be positioned to enable enhanced or improve degrees of freedom of the upper electrode pattern 170, which may assure improved or enhanced reliability of switching actions of the semiconductor device and may maintain an optimized manufacturing yield.

Figure 10:
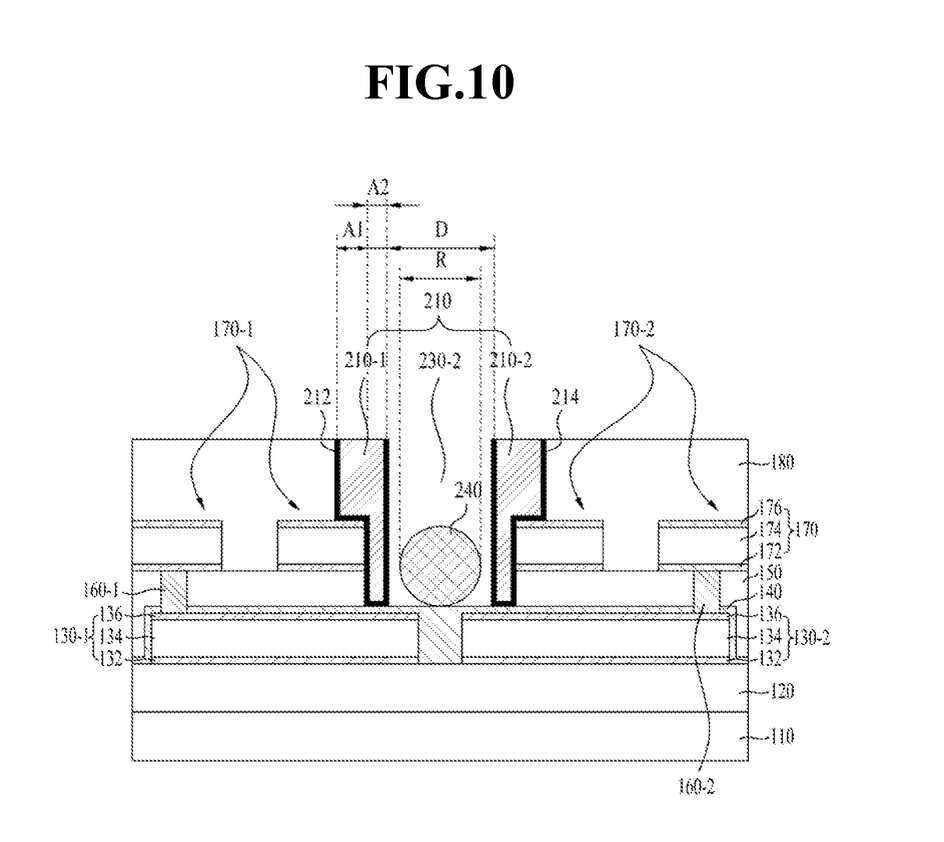

Referring to example FIG. 10, in embodiments, a contact ball 240 may be formed on/over the etch stop film 140 in the cavity 230-2. The contact ball 240 may be formed to have a diameter R smaller than a distance D between the barrier layers exposed by the cavity 230-2, in embodiments, In embodiments where there is no barrier layers 212 and 214, a distance D may be the distance between the etch blocking layers 210-1 and 210-2.

In example embodiments, the contact ball 240 may be formed using at least one of the following steps: (1) A conductive material layer (e.g. a metal layer) may be formed on/over the etch stop film 140 in the photoresist pattern 220 and the cavity 230-2 for forming the contact ball 240. (2) A lift-off may be performed to remove the photoresist pattern 220 and the conductive material layer positioned thereon, where the lift-off does not remove the conductive material layer positioned on the etch stop film 140 in the cavity 230-2 to leave a portion of the conductive material on the etch stop film 140 in the cavity 230-2. (3) The portion of the conductive material remaining in the cavity 230-2 may be subjected to annealing to form the contact ball 240 on the etch stop film 140 in the cavity 230-2. (4) The cavity 230-2 may form an air void, and as the contact ball 240 is brought into contact with any one of the first etch blocking layer 210-1 and the second etch blocking layer 210-2, the semiconductor device may perform a switching action.

Figure 1:
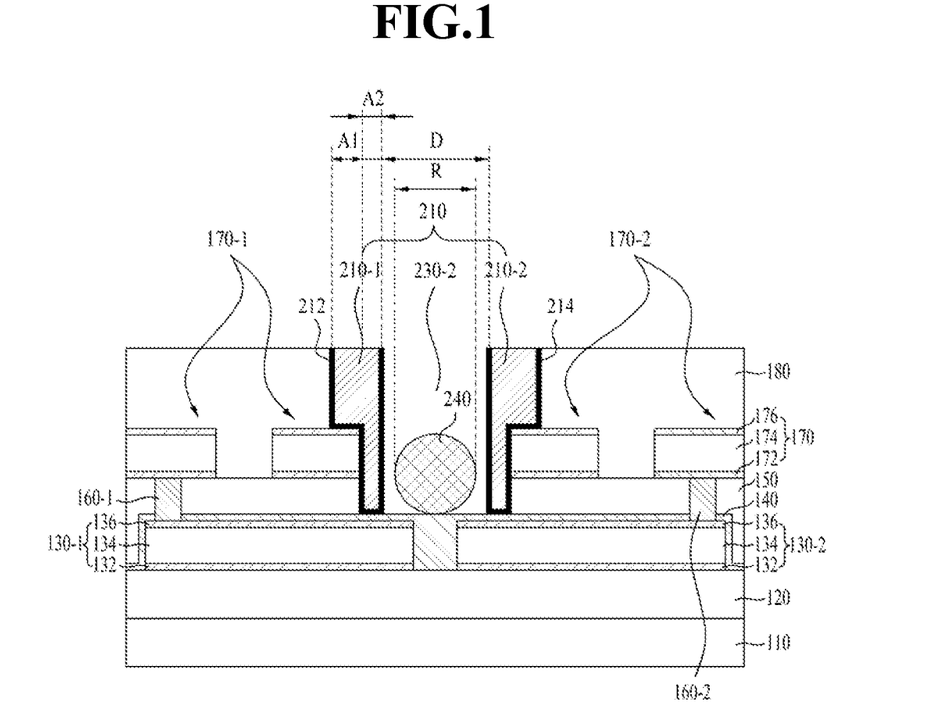
FIG. 1 illustrates a section of a semiconductor device, in accordance with embodiments.

Example FIG. 1 illustrates a section of a semiconductor device 100 in accordance with embodiments. The semiconductor device 100 may be a Micro Metal Sphere switch. In embodiments, the semiconductor device 100 may include at least one of: (1) an insulating layer 120 formed on/over a substrate 110, (2) a lower electrode pattern 130 formed on/over the insulating layer 120, (3) an etch stop film 140 formed on/over the lower electrode pattern 130, (4) a first interlayer insulating layer 150 formed on/over the etch stop film 140, (5) a contact 160 connected to the lower electrode pattern 130 that passes through the first interlayer insulating layer 150, (6) an upper electrode pattern 170 formed on/over the first interlayer insulating layer 150 connected to the contact, (7) a second interlayer insulating layer 180 formed on/over the upper electrode pattern 170, (8) a cavity 230-2 formed in the second interlayer insulating layer 180 and the first interlayer insulating layer 150 to expose a side of the upper electrode pattern 170 and the etch stop film 140, (9) a contact ball 240 positioned on/over the etch stop film 140 in the cavity 230-2, and (10) an etch blocking layer 210 formed on/over a side of the upper electrode pattern 170 exposed by the cavity 230-2.

The contact ball 240 may be brought into contact with any one of the first etch blocking layer 210-1 and the second etch blocking layer 210-2, in accordance with embodiments. The switching action of the device may be fixed depending on to which one of the first etch blocking layer 210-1 or the second etch blocking layer 210-2 the contact ball 240 is brought into contact, in accordance with embodiments.

For example, in embodiments, the upper electrode pattern 170 may include a third upper electrode electrically separated from the first upper electrode 170-1 and the second upper electrode 170-2 and a third etch blocking layer which covers a side of the third upper electrode.

In embodiments, if the contact ball 240 is brought into contact with the first etch blocking layer 210-1 and the third etch blocking layer at the same time, a first switching may take place, in which the first upper electrode 170-1 and the third upper electrode are electrically connected. If the contact ball 240 is brought into contact with the second etch blocking layer 210-2 and the third etch blocking layer at the same time, a second switching may take place, in which the second upper electrode 170-2 and the third upper electrode are electrically connected, in accordance with embodiments.

As has been described, embodiments form an upper electrode pattern which is insensitive to etchant used in wet etching for securing a space for positioning a contact ball therein, which may thereby improving degrees of freedom of the upper electrode pattern, which may optimize reliability of switching action of the semiconductor device, and may optimize manufacturing yield.

Characteristics, structures, effects, and so on described in the embodiments are include multiple embodiments and are not limited to only one embodiment invariably. Furthermore, it is apparent that the features, the structures, the effects, and so on described in the embodiments can be combined, or modified with other embodiments by persons skilled in this field of art. Therefore, it is required to understand that such combination and modification is included to scope of the embodiments.

What is claimed is:

1. A method of manufacturing a semiconductor device comprising:
   forming a lower electrode pattern over a substrate;
   forming a first interlayer insulating layer over the lower electrode pattern;
   forming an upper electrode pattern over the first interlayer insulating layer;
   forming a second interlayer insulating layer over the upper electrode pattern;
   forming an etch blocking layer on a side of the upper electrode pattern, wherein the etch blocking layer passes through the first interlayer insulating layer;
   forming a cavity which exposes the side of the etch blocking layer by etching the second interlayer insulating layer; and
   forming a contact ball in the cavity.

2. The method of claim 1, comprising forming an etch stop film between the lower electrode pattern and the first interlayer insulating layer.

3. The method of claim 1, wherein said forming a lower electrode pattern comprises forming a plurality of lower electrodes spaced apart from one another over the substrate.

4. The method of claim 1, wherein said forming an upper electrode pattern comprises forming a plurality of upper electrodes spaced apart from one another over the first interlayer insulating layer.

5. The method of claim 4, wherein said forming an etch blocking layer comprises forming an etch blocking layer covering a side of each of the plurality of upper electrodes.

6. The method of claim 4, wherein said forming an etch blocking layer comprises:
   forming a plurality of trenches, where each of the plurality of trenches exposes a side of each of the plurality of the upper electrodes; and
   forming the etch blocking layer by filling the plurality of trenches with a conductive material.

7. The method of claim 1, wherein:
   the upper electrode pattern comprises at least one of Al, Cu, Au, and an alloy including at least one of Al, Cu, and Au;
   the first interlayer insulating layer and the second interlayer insulating layer comprise at least one of $SiO_2$, $Si_xN_y$ (where x, and y are real numbers), FSG (Fluoro Silicate glass), USG (Undoped Silicate Glass), BPSG (Boron Phospho Silicate Glass), and TEOS (Tetra-EthOxySilane); and
   the etch blocking layer comprises tungsten.

8. The method of claim 6, wherein each of the trenches exposes a portion of an upper side of the upper electrode adjacent to an exposed side of the upper electrode.

9. The method of claim 4, wherein said forming the etch blocking layer comprises forming the etch blocking layer over a side of the upper electrode and over a portion of the upper side of the upper electrode adjacent to the side of the upper electrode.

10. The method of claim 2, wherein said forming the etch blocking layer comprises forming the etch blocking layer to be in contact with the etch stop film and passes through the second interlayer insulating layer.

11. The method of claim 10, wherein said etching the second interlayer insulating layer to form a cavity comprises:
    forming a hole which exposes the etch stop film by first etching the second interlayer insulating layer and the first interlayer insulating layer; and
    forming a cavity which exposes the etch blocking layer by second etching the second interlayer insulating layer and the first interlayer insulating layer which are first etched.

12. The method of claim 11, wherein the first etching is dry etching and the second etching is wet etching.

13. The method of claim 6, comprising forming a barrier layer between the etch blocking layer and the trench.

14. The method of claim 2, comprising:
    forming a contact in contact with the lower electrode pattern which passes through the first interlayer insulating layer and the etch stop film; and
    forming the second upper electrode pattern to be in contact with the contact.

\* \* \* \* \*